(12) United States Patent
Chiang et al.

(10) Patent No.: US 8,547,166 B2
(45) Date of Patent: Oct. 1, 2013

(54) TEMPERATURE COMPENSATION CIRCUIT AND TEMPERATURE COMPENSATED METAL OXIDE SEMICONDUCTOR TRANSISTOR USING THE SAME

(75) Inventors: Ju-An Chiang, Hsinchu (TW); Hsing-Wen Chang, Toufen Township, Miaoli County (TW)

(73) Assignee: Macronix International Co., Ltd., Hsinchu (TW)

( * ) Notice: Subject to any disclaimer, the term of this patent is extended or adjusted under 35 U.S.C. 154(b) by 13 days.

(21) Appl. No.: 13/194,039

(22) Filed: Jul. 29, 2011

(65) Prior Publication Data

US 2013/0027116 A1    Jan. 31, 2013

(51) Int. Cl.
*G05F 1/10*    (2006.01)
(52) U.S. Cl.
USPC ............................................ 327/534; 327/513
(58) Field of Classification Search
USPC .................................................. 327/534–535
See application file for complete search history.

(56) References Cited

U.S. PATENT DOCUMENTS

| | | | | |
|---|---|---|---|---|
| 4,717,836 A * | 1/1988 | Doyle | | 326/71 |
| 5,614,816 A * | 3/1997 | Nahas | | 323/316 |
| 6,304,110 B1 * | 10/2001 | Hirano | | 327/108 |
| 6,556,068 B2 * | 4/2003 | Forbes et al. | | 327/537 |
| 6,809,968 B2 * | 10/2004 | Marr et al. | | 365/185.24 |
| 6,815,997 B2 * | 11/2004 | Dathe et al. | | 327/356 |
| 6,847,252 B1 * | 1/2005 | Ono et al. | | 327/537 |
| 6,876,250 B2 | 4/2005 | Hsu et al. | | |
| 6,917,237 B1 * | 7/2005 | Tschanz et al. | | 327/513 |
| 7,038,482 B1 * | 5/2006 | Bi | | 324/762.09 |
| 7,068,024 B1 * | 6/2006 | Huang | | 323/315 |
| 7,119,604 B2 * | 10/2006 | Chih | | 327/534 |
| 7,456,478 B2 * | 11/2008 | Tsutsumi | | 257/360 |
| 7,667,528 B2 * | 2/2010 | Kim | | 327/534 |
| 7,733,148 B2 * | 6/2010 | Kim | | 327/262 |
| 7,969,194 B2 * | 6/2011 | Sumita | | 326/82 |
| 7,994,846 B2 * | 8/2011 | Katz et al. | | 327/537 |
| 8,152,371 B2 * | 4/2012 | Tajima | | 374/170 |
| 8,222,952 B2 * | 7/2012 | Miyatake et al. | | 327/534 |
| 2009/0039944 A1 * | 2/2009 | Ogiwara et al. | | 327/512 |
| 2010/0321094 A1 * | 12/2010 | Luo et al. | | 327/513 |
| 2012/0195138 A1 * | 8/2012 | Son | | 365/189.07 |

* cited by examiner

*Primary Examiner* — Thomas J Hiltunen
(74) *Attorney, Agent, or Firm* — McClure, Qualey & Rodack, LLP

(57) ABSTRACT

A temperature compensation circuit, applied on a metal oxide semiconductor (MOS) transistor, with a threshold voltage varying with respect to a temperature value of the MOS transistor, for having the MOS transistor corresponding to an equivalent threshold voltage substantially with a constant value throughout a temperature range, comprises a voltage generator. The voltage generator provides a voltage proportional to absolute temperature (VPTAT) to drive the body of the MOS transistor in such way that a variation of the threshold voltage due to temperature variation of the MOS transistor is substantially compensated with a variation of the threshold voltage due to body-source voltage variation of the MOS transistor, so that the MOS transistor corresponds to the equivalent threshold voltage that is temperature invariant.

10 Claims, 7 Drawing Sheets

US 8,547,166 B2

TEMPERATURE COMPENSATION CIRCUIT AND TEMPERATURE COMPENSATED METAL OXIDE SEMICONDUCTOR TRANSISTOR USING THE SAME

BACKGROUND OF THE INVENTION

1. Field of the Invention

The invention relates in general to a temperature compensation circuit, and more particularly to a temperature compensation circuit applied on a metal oxide semiconductor (MOS) transistor for its threshold voltage compensation.

2. Description of the Related Art

In the present age, semiconductor transistor technology has been wildly employed to various kinds of applications. Generally, a transistor, e.g. a metal oxide semiconductor (MOS) transistor, has a threshold voltage. When a bias voltage greater than or equal to the threshold voltage is applied to the MOS transistor, the MOS transistor is turned on with a substantially stable current flowing therethrough; otherwise, the MOS transistor is kept in cutoff state. Conventionally, it is well known that the threshold voltage of a transistor is a function of temperature. In other words, the threshold voltage of the MOS transistor varies with fluctuation of temperature of the MOS transistor. However, there have been demands on transistors with temperature invariant threshold voltage in some applications and how to provide transistors with temperature invariant threshold voltage has therefore become a prominent object for the industries.

SUMMARY OF THE INVENTION

The invention is directed to a temperature compensation circuit applied on a metal oxide semiconductor (MOS) transistor, having a threshold voltage varying with respect to a temperature value of the MOS transistor. The temperature compensation circuit includes a voltage generator capable of providing a voltage proportional to absolute temperature (VPTAT) to drive the body of the MOS transistor, in such way that variation of the threshold voltage due to temperature variation of the MOS transistor is substantially compensated with a variation of the threshold voltage due to body-source voltage variation of the MOS transistor, so that the MOS transistor equivalently corresponds to a temperature invariant threshold voltage. Thus, in comparison to the conventional MOS transistor, the temperature compensation circuit and the temperature compensated MOS transistor using the same is advantageously with an equivalent threshold voltage that is temperature invariant.

According to a first aspect of the present invention, a temperature compensation circuit is provided. The temperature compensation circuit, applied on a MOS transistor, with a threshold voltage varying with respect to a temperature value of the MOS transistor, for having the MOS transistor corresponding to an equivalent threshold voltage substantially with a constant value throughout a temperature range, comprises a voltage generator. The voltage generator provides a voltage proportional to absolute temperature (VPTAT) to drive the body of the MOS transistor in such way that a variation of the threshold voltage due to temperature variation of the MOS transistor is substantially compensated with a variation of the threshold voltage due to body-source voltage variation of the MOS transistor, so that the MOS transistor corresponds to the equivalent threshold voltage that is temperature invariant.

According to a second aspect of the invention, a temperature compensated MOS transistor having an equivalent threshold voltage substantially corresponding to a constant value throughout a temperature range is provided. The temperature compensated MOS transistor comprises a MOS transistor and a temperature compensation circuit. The MOS transistor has a threshold voltage varying with respect to a temperature value of the MOS transistor. The temperature compensation circuit comprises a voltage generator. The voltage generator provides a VPTAT to drive the body of the MOS transistor in such way that a variation of the threshold voltage due to temperature variation of the MOS transistor is substantially compensated with a variation of the threshold voltage due to body-source voltage variation of the MOS transistor, so that the MOS transistor corresponds to the equivalent threshold voltage that is temperature invariant.

The invention will become apparent from the following detailed description of the preferred but non-limiting embodiments. The following description is made with reference to the accompanying drawings.

BRIEF DESCRIPTION OF THE DRAWINGS

FIG. 6 is a circuit diagram of the constant voltage generation unit 10a.

FIG. 11 is a detailed block diagram of the temperature correlated current generation unit 20a.

DETAILED DESCRIPTION OF THE INVENTION

Figure 1:
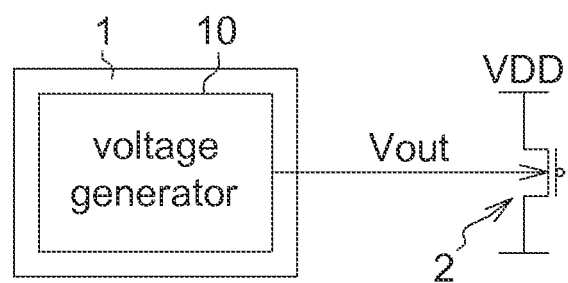
FIG. 1 is a block diagram of the temperature compensation circuit according to an embodiment of the invention.

Referring to FIG. 1, a block diagram of the temperature compensation circuit according to an embodiment of the invention is shown. The temperature compensation circuit 1 is applied on a metal oxide semiconductor (MOS) transistor 2. For example, the threshold voltage Vth of the MOS transistor 2 satisfies the following formula (1):

$$V_{TP} = V_{TP0}(t) + \gamma \left[ (V_{SB\text{-}S} + |2\Phi_F|)^{\frac{1}{2}} - (|2\Phi_F|)^{\frac{1}{2}} \right] \quad (1)$$

wherein $V_{TP}(t)$ is a function of temperature t; $V_{SB\text{-}S}$ is the voltage difference between the body and the source of the MOS transistor 2; γ and $\Phi_F$ are parameters related to the manufacture process of the MOS transistor 2.

Figure 2:
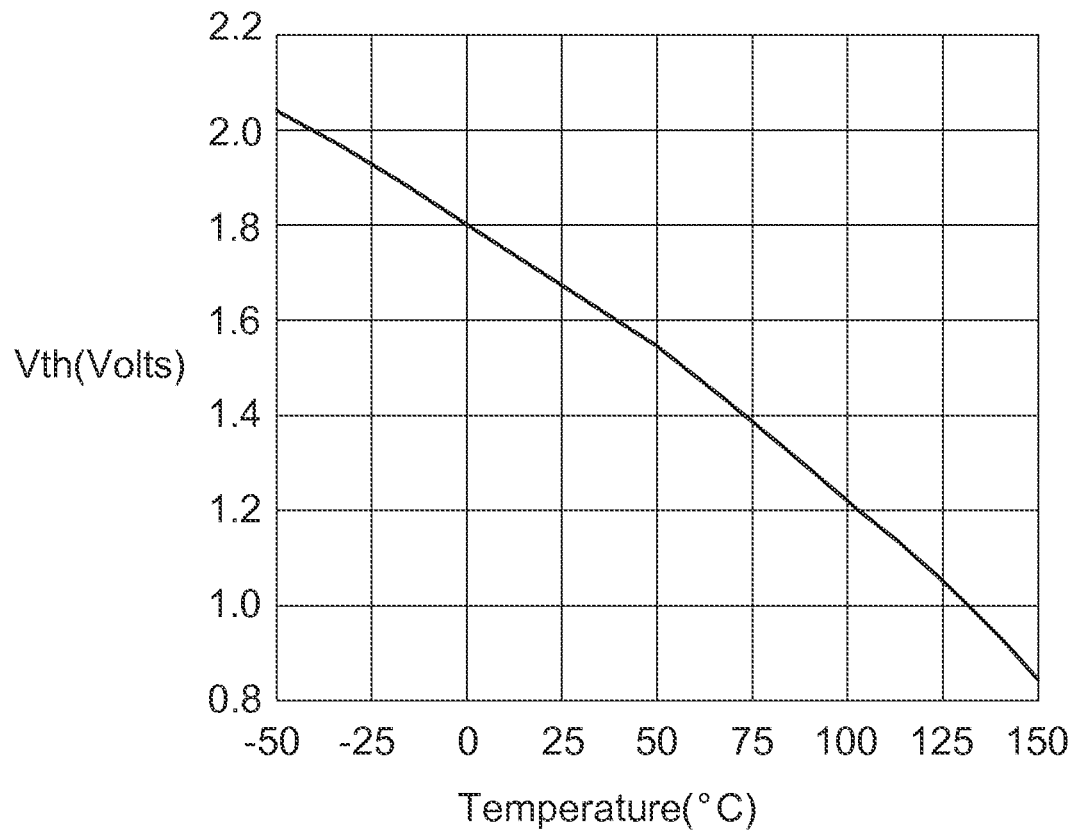
FIG. 2 is an illustration for the variation of the threshold voltage Vth with temperature of the MOS transistor 2.

According to formula (1), it can be obtained that the MOS transistor 2 has a threshold voltage Vth varying with respect to a temperature value of the MOS transistor 2. For example, the variation of the threshold voltage Vth with temperature of the MOS transistor 2 is illustrated by FIG. 2. As shown in FIG. 2, it can be obtained that the threshold voltage Vth gets lower when the temperature gets higher. References, such as IEEE Transactions on electron devices, published on June 1971, can be referred for providing much detailed description on the correlation between the temperature and the threshold voltage Vth of the MOS transistor 2.

On the other hand, the threshold voltage Vth of the MOS transistor 2 further satisfies formula (2):

$$V_{TP} = V_{TP0} + \alpha \times V_{SB-S} \qquad (2)$$

wherein α and $V_{TP0}$ are constants, and $V_{SB-S}$ is the body to source voltage of the MOS transistor 2.

Figure 3:
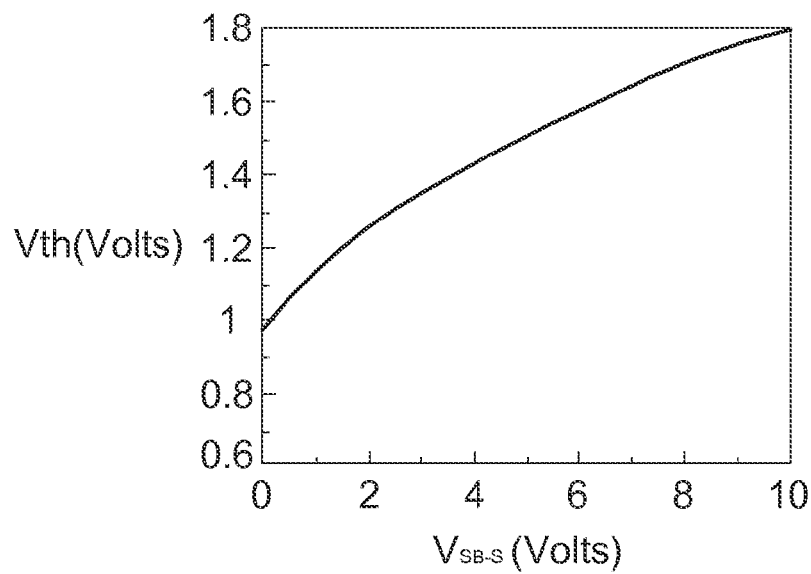
FIG. 3 is an illustration for the variation of the threshold voltage Vth with the body source voltage $V_{SB\text{-}S}$ of the MOS transistor 2.

According to formula (2), it can be obtained that the MOS transistor 2 has a threshold voltage Vth varying with respect to the body-source voltage $V_{SB-S}$ of the MOS transistor 2. For example, under the condition that the source voltage of the MOS transistor 2 is fixed at the high level reference voltage VDD, the variation of the threshold voltage Vth with the body source voltage $V_{SB-S}$ of the MOS transistor 2 is illustrated by FIG. 3. As shown in FIG. 3, it can be obtained that the threshold voltage Vth gets higher when the body source voltage $V_{SB-S}$ gets higher. References, such as Fundamentals of Modern VLSI Devices, a textbook authored by Yuan Taur; TAK H. Ning, can be referred for providing much detailed description on the correlation between the body-source voltage and the threshold voltage Vth of the MOS transistor 2.

According to FIGS. 2 and 3, it can be obtained that the threshold voltage Vth is substantially negatively proportional to the temperature of the MOS transistor 2, while is substantially positively proportional to the body-source voltage $V_{SB-S}$ of the MOS transistor 2. As such, the temperature compensation circuit 1 can effectively have the threshold voltage Vth compensated by means of manipulating the body-source voltage $V_{SB-S}$. For example, the temperature compensation circuit 1 has the MOS transistor 2 corresponding to an equivalent threshold voltage Vth_E that is substantially with a constant value throughout a temperature range.

Figure 4:
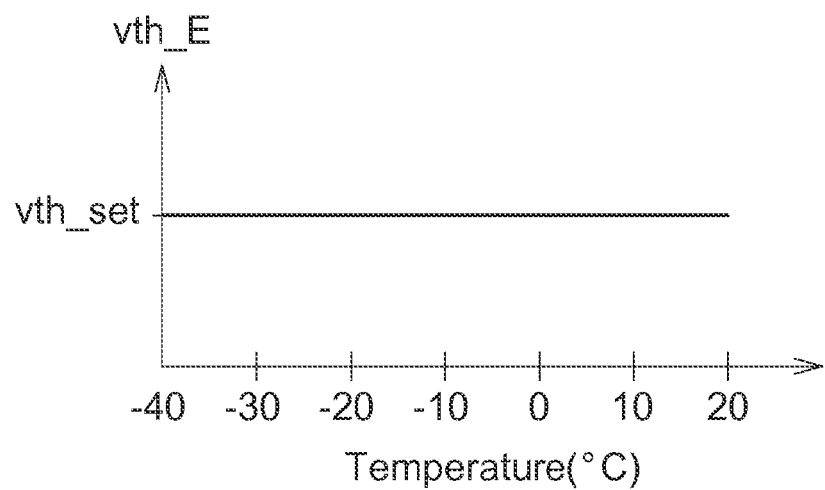
FIG. 4 is the illustration for equivalent threshold voltage Vth_E with temperature of the MOS transistor 2.

The temperature compensation circuit 1 includes a voltage generator 10. The voltage generator 10 provides a voltage proportional to absolute temperature (VPTAT) Vout to drive the body of the MOS transistor 2 in such way that a variation of the threshold voltage Vth due to temperature variation of the MOS transistor 2 is substantially compensated with a variation of the threshold voltage 2 due to body-source voltage. For example, the illustration of the equivalent threshold voltage Vth_E with temperature of the MOS transistor 2 is shown in FIG. 4. As such, the equivalent threshold voltage Vth_E corresponds to a designed level Vth_set throughout a temperature range, e.g. from −40° C. to 20° C.

The minimum body-source voltage $V_{SB-S}$ is determined as a voltage capable of preventing the body and the source of the MOS transistor 2 from being forward biased, i.e. 0 Volts. In other words, the minimum body voltage $V_{SB}$ is equal to the high level reference voltage VDD. As a result, the lowest level of the threshold voltage Vth achievable by the body-source voltage $V_{SB-S}$ is then fixed.

On the other hand, the Vth-to-temperature curve, as illustrated in FIG. 2, of the MOS transistor 2 depends on manufacturing processes. In other words, MOS transistors implemented with different manufacturing processes correspond to different Vth-to-temperature curves. Thus, Vth-to-$V_{SB-S}$ curves with different slopes may be needed for respectively compensating the Vth-to-temperature curves of the respective MOS transistor corresponding to different manufacturing processes, and accordingly have the MOS transistors corresponded to the equivalent threshold voltage Vth_E, e.g. illustrated in FIG. 4.

Figure 5:
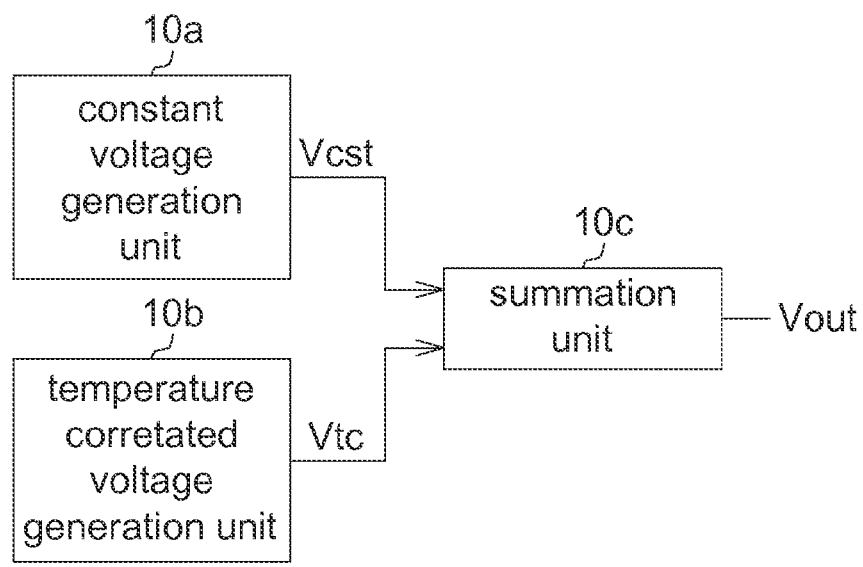
FIG. 5 is a detailed block diagram of the voltage generator 10.

Referring to FIG. 5, a detailed block diagram of the voltage generator 10 is shown. For example, the voltage generator 10 includes a constant voltage generation unit 10a, a temperature correlated voltage generation unit 10b, and a summation unit 10c.

The constant voltage generation unit 10a provides a constant voltage $V_{cst}$, determining by a minimum body-source voltage $V_{SB-S\_min}$ capable of preventing forward biasing between the body and the source of the MOS transistor 2. The temperature correlated voltage generation unit 10b determines a temperature correlated voltage $V_{tc}$ in response to the temperature value of the MOS transistor 2. The summation unit 10c provides the VPTAT Vout according to the constant voltage $V_{cst}$ and the temperature correlated voltage $V_{tc}$. Based on the above, the body-source voltage $V_{SB-S}$ satisfies the following formula (4):

$$V_{SB-S} = \text{VPTAT} - \text{VDD} \qquad (3)$$

wherein the VPTAT Vout and satisfies the following formula (4):

$$\text{VPTAT} = V\text{out} = V_{cst} + V_{tc} \qquad (4)$$

wherein $V_{cst}$ is the constant voltage provided by the constant voltage generation unit 10a; and $V_{tc}$ is the temperature correlated voltage provided by the temperature correlated voltage generation unit 10b. For example, the temperature correlated voltage $V_{tc}$ has a level greater than or equal to 0 volts. The high level reference voltage VDD has a constant voltage level, such that the body to source voltage $V_{SB-S}$ and the VPTAT are the only two variables in formula (3).

In an example, the MOS transistor 2 is a P type MOS transistor and the source of the MOS transistor 2 is biased at a high level reference voltage VDD. In order to prevent the body and the source of the transistor MOS transistor 2 from being forwardly biased, the constant voltage $V_{cst}$ is configured with the same level as the high level reference voltage VDD. In other words, the minimum VPTAT Vout provided by the voltage generator 10 is equal to the high level reference voltage VDD, such that the minimum body-source voltage $V_{SB-S\_min}$ is accordingly designed as VDD−VDD=0 volts. As such, the body and the source of the MOS transistor 2 can be prevented from being forwardly biased by means of providing the constant voltage $V_{cst}$, having the same voltage level as the high level reference voltage VDD.

Figure 6:
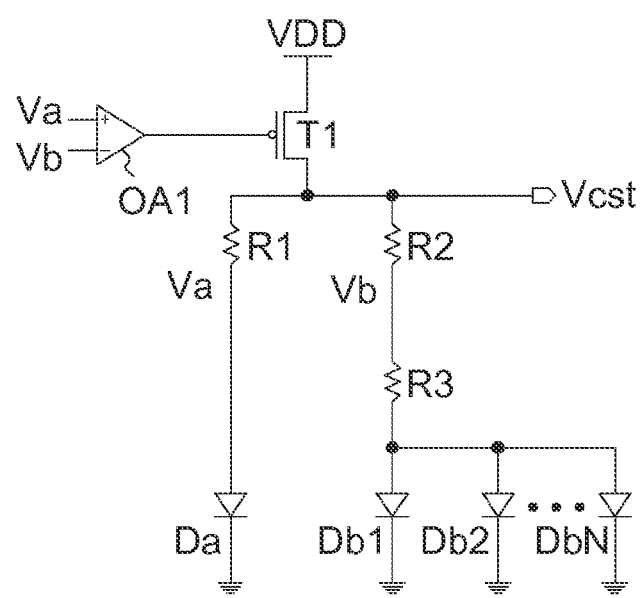

For an embodiment, the constant voltage generation unit 10a can be implemented with the circuit illustrated in FIG. 6, wherein resistors R1-R3, diodes Da, Db1-DbN, operational amplifier OA1, and transistor T1 are employed therein. For example, the constant voltage $V_{cst}$ provided by the constant voltage generation unit 10a satisfies the following formula (5):

$$Vcst = V_f + \frac{R2}{R3} \times dV_f \qquad (5)$$

wherein Vf is the voltage across the diode Da; and $dV_f$ satisfies the following formula (6):

$$\text{where } dV_f = U_T \times \ln\left(N \times \frac{R2}{R1}\right) \quad (6)$$

wherein, $U_T$ is the thermal voltage determined with Boltzmann constant K, absolute temperature K, and magnitude of the electrical charge q.

Figure 7:
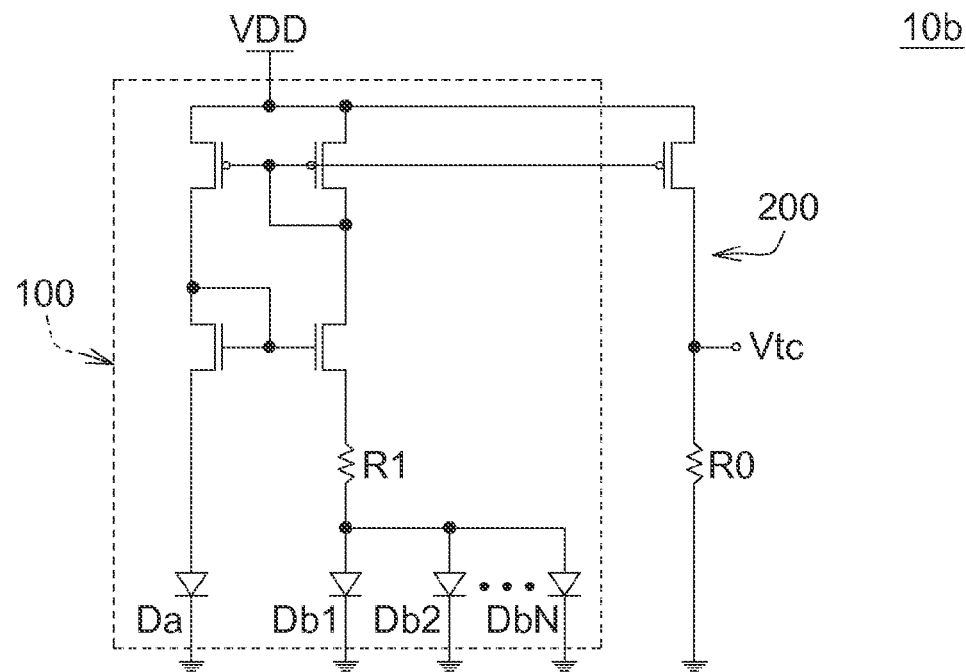
FIG. 7 is a circuit diagram of the temperature correlated voltage generation unit 10b.

For an embodiment, the temperature correlated voltage generation unit 10b can be implemented with the circuit illustrated in FIG. 7, wherein a temperature sensitive current source 100, employed as an active circuit for generating a temperature-sensitive current, and a mirrored current source 200, employed as a mirrored circuit for obtaining a mirrored current corresponding to the temperature-sensitive current, are included therein. The mirrored current source 200 further includes a resistor R0, and the mirrored current flows through the resistor R0, so as to obtain the temperature correlated voltage $V_{tc}$. For example, the current flowing through the resistor R1 and the temperature correlated voltage $V_{tc}$ respective satisfy the following formula (7) and (8):

$$I = \frac{U_T \times \ln(N)}{R1} \quad (7)$$

$$Vtc = \left(\frac{U_T \times \ln(N)}{R1}\right) \times R0 \quad (8)$$

wherein, $U_T$ is the thermal voltage determined with Boltzmann constant K, absolute temperature K, and magnitude of the electrical charge q.

Figure 8:
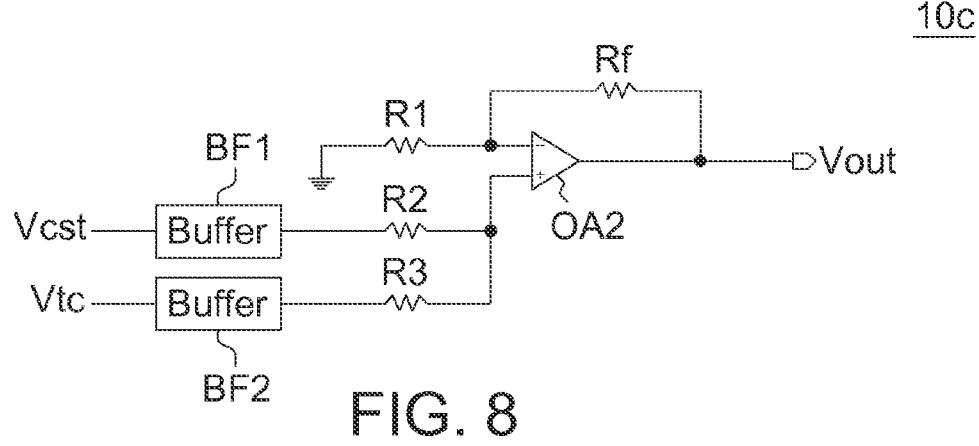
FIG. 8 is a circuit diagram of the summation unit 10c.

For an embodiment, the summation unit 10c can be implemented with the circuit illustrated in FIG. 8, wherein resistors R1-R3 and Rf and operational amplifier OA2 are included therein. The VPTAT Vout further satisfies the following formula (9):

$$Vout \frac{R3}{R2+R3} \times Vtc \times \frac{R1+Rf}{R1} + \frac{R2}{R2+R3} \times Vcst \times \frac{R1+Rf}{R1} \quad (9)$$

As one may observe from the formula (9), arbitrary scaling factors for both $V_{tc}$ and $V_{cst}$ are possible by selecting proper $R_1$, $R_2$, $R_3$ and $R_f$.

Figure 9:
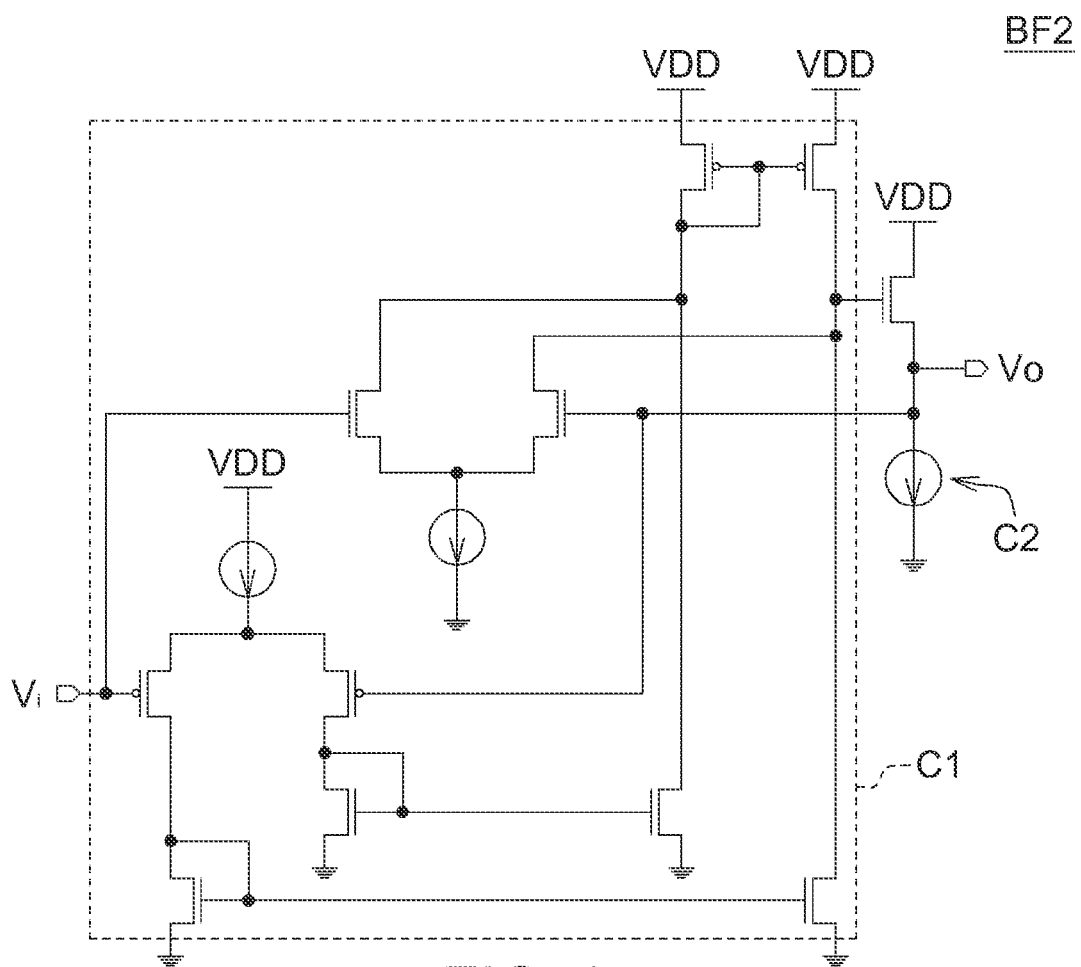
FIG. 9 is a detailed circuit diagram of the buffer BF2 in FIG. 8.

The summation unit 10c further includes buffers BF1 and BF2. The buffer BF2 is implemented with the circuit structure shown in FIG. 9, wherein a rail to rail input circuit c1, employed for accommodating all DC input range of the inputted temperature correlated voltage $V_{tc}$, and a second stage circuit c2, employed to drive its load without voltage amplification are included in the buffer BF2. For example, the buffer BF1 can also be implemented with the circuit structure shown in FIG. 9 and the output signal Vo and the input Vi of the buffer BF2 satisfies the condition: Vo=Vi.

Figure 10:
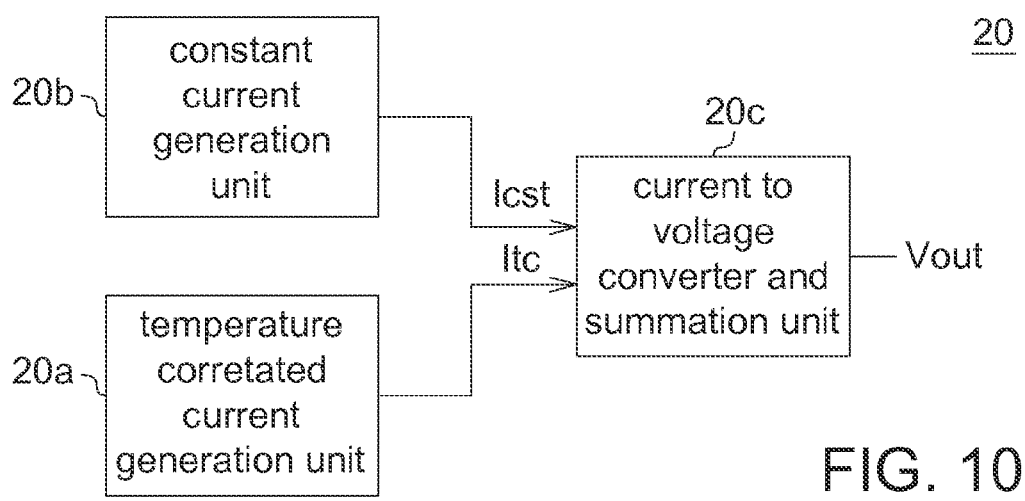
FIG. 10 is a detailed block diagram of the voltage generator 20.
Figure 11:
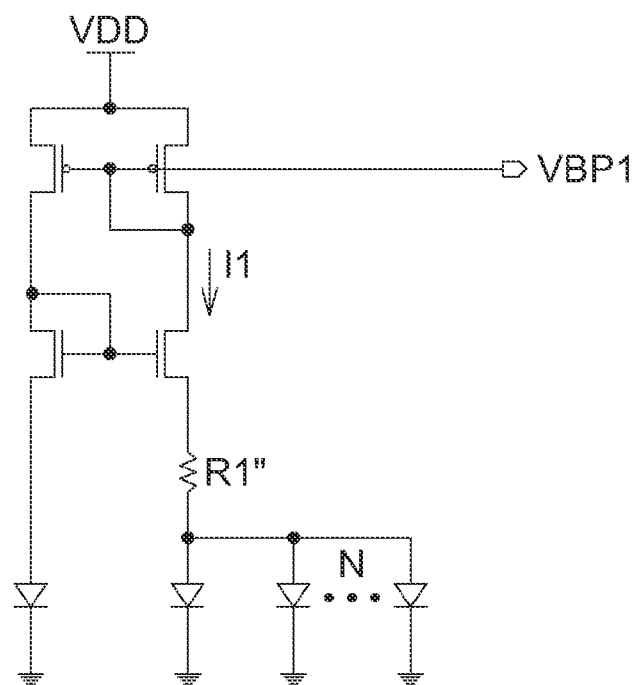

For another embodiment, the voltage generator 20 can also be implemented with a temperature correlated current generation unit 20a, a constant current generation unit 20b, and a current to voltage converter and summation unit 20c, as shown in FIG. 10. The temperature correlated current generation unit 20a providing a temperature correlated current $I_{tc}$ in response to the temperature value of the MOS transistor 2. The temperature correlated current generation unit 20a, for example, has a circuit structure shown in FIG. 11. In detail, the output current I1 satisfies the following formula (10):

$$I1 = \frac{U_T \times \ln(N)}{R1''} \quad (10)$$

wherein, $U_T$ is the thermal voltage determined with Boltzmann constant K, absolute temperature K, and magnitude of the electrical charge q.

Figure 12:
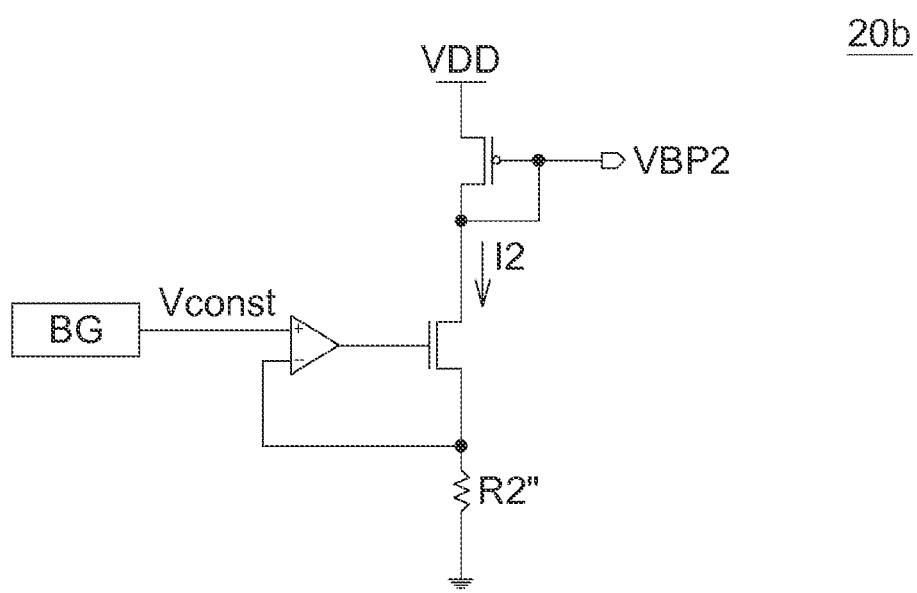
FIG. 12 is a detailed block diagram of the constant current generation unit 20b.

The constant current generation unit 20b, for example, has a circuit structure shown in FIG. 12. In detail, the output current I2 provided by the constant current generation unit 20b satisfies the following formula (11):

$$I2 = \frac{V_{const}}{R2''} \quad (11)$$

wherein $V_{const}$ is a constant voltage provided by the band gap circuit BG. Thus, the constant current generation unit 20b provides a constant current $I_{cst}$.

Figure 13:
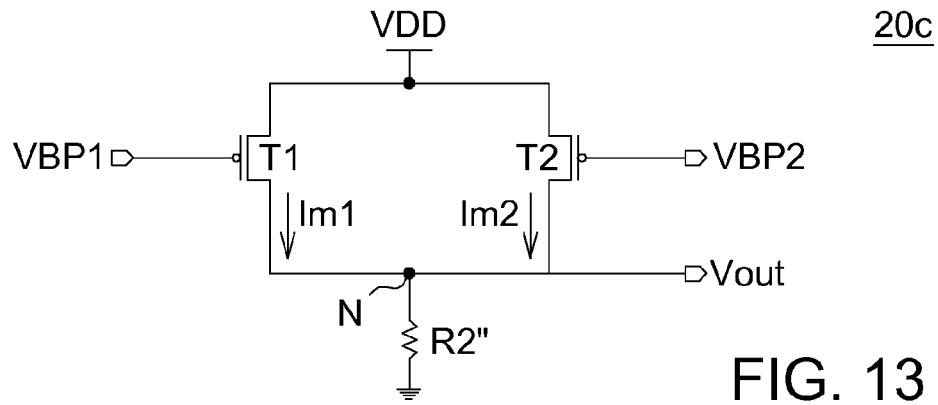
FIG. 13 is a detailed block diagram of the current to voltage converter and summation unit 20c.

The current to voltage converter and summation unit 20c provides the output voltage Vo by means of current summation and current-to-voltage conversion according to the temperature correlated current $I_{tc}$ and the constant current $I_{cst}$. For example, the current to voltage converter and summation unit 20c has a circuit structure shown in FIG. 13. In detail, the current to voltage converter and summation unit 20c includes transistors T1, T2, and nodes VBP1, VBP2, and N. The nodes VBP1 and VBP2 are respectively connected to the node VBP1 shown in FIG. 11 and the node VBP2 shown in FIG. 12, so that current mirrors are formed for having the transistor T1 mirrored with a source current Im1 corresponding to the current I1 and having the transistor T2 mirrored with a source current Im2 corresponding to the current I2. The source currents Im1 and Im2 are further summed at the node N and converted to the VPTAT Vout. For example, the VPTAT Vout satisfies the following formula (12):

$$Vout = \left(\frac{Vcst}{R2''} + U_T \times \frac{\ln(N)}{R1''}\right) \times R2'' = Vcst + \left(U_T \times \frac{\ln(N)}{R1''}\right) \times R2'' \quad (12)$$

wherein, $U_T$ is the thermal voltage determined with Boltzmann constant K, absolute temperature K, and magnitude of the electrical charge q; N is the number of diodes connected to the resistor R1" in FIG. 11. The formula (12) is obtained by assuming mirror ratio is one. It is again, however, arbitrary scaling factors are possible by selecting proper mirror ratio.

Though only the situation that the MOS transistor 2 is a P type MOS transistor is illustrated as an example in the present embodiment of the invention, the MOS transistor 2 is not limited thereto. In other example, the MOS transistor 2 can also be an N type MOS transistor, and similar threshold voltage compensation can also be achieved with similar temperature compensation circuit illustrated hereinabove.

Figure 14:
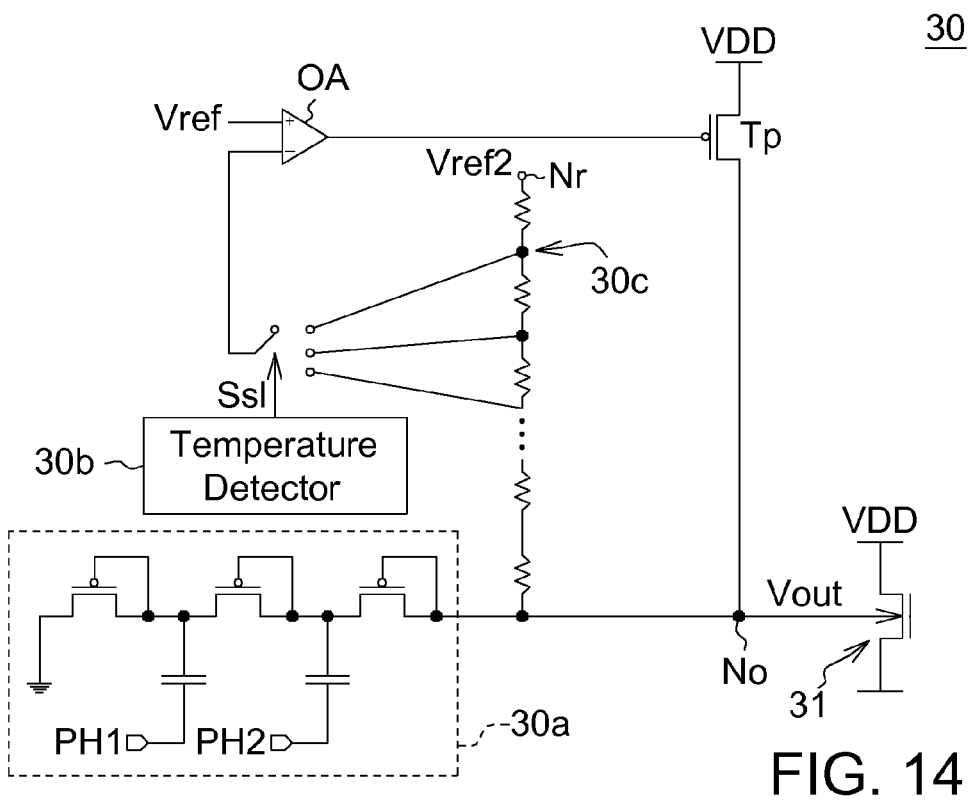
FIG. 14 is a circuit diagram of the voltage generator 30.
Figure 15:
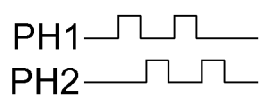
FIG. 15 is a related signal flow chart of the voltage generator 30 in FIG. 14.

Referring to FIGS. 14 and 15, a detailed block diagram of the voltage generator 30 and a related signal flow chart of the voltage generator 30 in FIG. 14 are shown. In an example, the voltage generator 30 includes an operation amplifier OA, a negative charge pump 30a, a temperature detector 30b, a load circuit 30c, transistor Tp, nodes Nr and No. The negative charge pump 30a is employed for providing a voltage with negative voltage level to an output node No. The temperature detector 30b senses the temperature of the MOS transistor 2 and accordingly providing a selection signal Ssl; and the load circuit 30c, in response to the selection signal Ssl, determines a load between the negative input end, corresponding to a reference voltage Vref, of the operation amplifier OA and a node Nr, corresponding to a constant reference voltage Vref2. The operation amplifier OA, the transistor Tp, and the load circuit 30c form a negative feedback loop for regulating the voltage at the output node No.

Though only the situation that the voltage generator with the circuit structure of FIG. 14 is employed for temperature compensation of N type MOS transistor 31 is cited as an example illustrated in the present embodiment of the invention, the temperature compensation circuit according to the present embodiment is not limited thereto. In other example, voltage generator with a positive charge pump, a temperature detector, and a positive voltage regulator can also be employed for temperature compensation of P type MOS transistor.

The temperature compensation circuit according to the present embodiment of the invention is applied on a MOS transistor, having a threshold voltage varying with respect to a temperature value of the MOS transistor. The temperature compensation circuit according to the present embodiment of the invention employs a voltage generator capable of providing a VPTAT to drive the body of the MOS transistor in such way that variation of the threshold voltage due to temperature variation of the MOS transistor is substantially compensated with a variation of the threshold voltage due to body-source voltage variation of the MOS transistor, so that the MOS transistor equivalently corresponds to a temperature invariant threshold voltage. Thus, in comparison to the conventional MOS transistor, the temperature compensation circuit and the temperature compensated MOS transistor using the same according to the present embodiment of the invention is advantageously with an equivalent threshold voltage that is temperature invariant.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A temperature compensation circuit, applied on a metal oxide semiconductor (MOS) transistor, the temperature compensation circuit comprising:
    a voltage generator, providing a voltage proportional to absolute temperature (VPTAT) to drive a body of the MOS transistor in such way that a variation of the threshold voltage due to temperature variation of the MOS transistor is substantially compensated with a variation of the threshold voltage due to body-source voltage variation of the MOS transistor, so that the MOS transistor corresponds to the equivalent threshold voltage that is temperature invariant;
    wherein the voltage generator further comprises:
    a constant voltage generation unit, providing a constant voltage, determining a body-source voltage capable of preventing forward biasing between the body and the source of the MOS transistor;
    a temperature correlated voltage generation unit, determining a temperature correlated voltage in response to a temperature value of the MOS transistor; and
    a summation unit, providing the VPTAT according to the constant voltage and the temperature correlated voltage.

2. The temperature compensation circuit according to claim 1, wherein the temperature correlated voltage generation unit comprises:
    a current mirror, comprising:
    an active circuit, providing a temperature correlated current; and
    a mirrored circuit, providing a mirrored current according to the temperature correlated current; and
    a current to voltage converter, providing the temperature correlated voltage according to the mirrored current.

3. The temperature compensation circuit according to claim 1, wherein the MOS transistor is an N type MOS transistor.

4. The temperature compensation circuit according to claim 1, wherein the MOS transistor is a P type MOS transistor.

5. A temperature compensation circuit, applied on a metal oxide semiconductor (MOS) transistor, the temperature compensation circuit comprising:
    a voltage generator, providing a voltage proportional to absolute temperature (VPTAT) to drive a body of the MOS transistor in such way that a variation of the threshold voltage due to temperature variation of the MOS transistor is substantially compensated with a variation of the threshold voltage due to body-source voltage variation of the MOS transistor, so that the MOS transistor corresponds to the equivalent threshold voltage that is temperature invariant;
    wherein the voltage generator further comprises:
    a constant current generation unit, determining a constant current;
    a temperature correlated current generation unit, providing a temperature correlated current in response to a temperature value of the MOS transistor; and
    a current to voltage converter and summation unit, providing a temperature correlated voltage and accordingly determining a body-source voltage capable of preventing forward biasing between the body and the source of the MOS transistor according to the temperature correlated current, the current to voltage converter and summation unit further providing a constant voltage according to the constant current, and obtaining the VPTAT according to the constant voltage and the temperature correlated voltage.

6. A temperature compensation circuit, applied on a metal oxide semiconductor (MOS) transistor, the temperature compensation circuit comprising:
    a voltage generator, providing a voltage proportional to absolute temperature (VPTAT) to drive a body of the MOS transistor in such way that a variation of the threshold voltage due to temperature variation of the MOS transistor is substantially compensated with a variation of the threshold voltage due to body-source voltage variation of the MOS transistor, so that the MOS transistor corresponds to the equivalent threshold voltage that is temperature invariant, wherein the voltage generator further comprises:
    an output node and a reference node with a reference voltage;
    a charge pump, for providing a pumped voltage to the output node;
    a temperature detector, providing a selection signal in response to a temperature value of the MOS transistor; and
    a voltage regulator, coupled between the output node and the reference node, the voltage regulator further determining a load coupled between the output node and a reference node and accordingly provides the VPTAT to the output node by means of voltage regulation.

7. A temperature compensated metal oxide semiconductor (MOS) transistor, comprising:
a MOS transistor, having a threshold voltage varying with respect to a temperature value of the MOS transistor; and
a temperature compensation circuit, comprising:
a voltage generator, providing a voltage proportional to absolute temperature (VPTAT) to drive a body of the MOS transistor, in such way that a variation of the threshold voltage due to temperature variation of the MOS transistor is substantially compensated with a variation of the threshold voltage due to body-source voltage variation of the MOS transistor, so that the MOS transistor corresponds to the equivalent threshold voltage that is temperature invariant;
wherein the voltage generator further comprises:
a constant voltage generation unit, providing a constant voltage, determining a body-source voltage capable of preventing forward biasing between the base and the source of the MOS transistor;
a temperature correlated voltage generation unit, determining a temperature correlated voltage in response to the temperature value of the MOS transistor; and
a summation unit, providing the VPTAT according to the constant voltage and the temperature correlated voltage.

8. The temperature compensated MOS transistor according to claim 7, wherein the temperature correlated voltage generation unit comprises:
a current mirror, comprising:
an active circuit, providing a temperature correlated current; and
a mirrored circuit, providing a mirrored current according to the temperature correlated current; and
a current to voltage converter, providing the temperature correlated voltage according to the mirrored current.

9. The temperature compensated MOS transistor according to claim 7, wherein the MOS transistor is an N type MOS transistor.

10. The temperature compensated MOS transistor according to claim 7, wherein the MOS transistor is a P type MOS transistor.

* * * * *